(12) United States Patent
Bayan et al.

(10) Patent No.: US 6,686,652 B1
(45) Date of Patent: Feb. 3, 2004

(54) LOCKING LEAD TIPS AND DIE ATTACH PAD FOR A LEADLESS PACKAGE APPARATUS AND METHOD

(75) Inventors: Jaime Bayan, Palo Alto; Peter H. Spalding, Cupertino, both of CA (US); Harry Cheng-Hong Kam, Melaka (MY); Ah Lek Hu, Bukit Baru (MY); Sharon Mei Wan Ko, Melaka (MY); Santhiran Nadarajah, Bachang (MY); Aik Seng Kang, Melaka (MY); Yin Yen Bong, Maleka (MY)

(73) Assignee: National Semiconductor, Santa Clara, CA (US)

( * ) Notice: Subject to any disclaimer, the term of this patent is extended or adjusted under 35 U.S.C. 154(b) by 0 days.

(21) Appl. No.: 09/616,228

(22) Filed: Jul. 14, 2000

Related U.S. Application Data
(60) Provisional application No. 60/190,587, filed on Mar. 20, 2000.

(51) Int. Cl.[7] .............................................. H01L 23/02
(52) U.S. Cl. .................... 257/678; 257/780; 257/782
(58) Field of Search ................................. 257/678, 692, 257/706, 782, 787, 776, 780, 786, 727; 438/106, 121, 118, 124, 127

(56) References Cited

U.S. PATENT DOCUMENTS

| | | | |
|---|---|---|---|
| 5,367,196 A | * 11/1994 | Mahulikar et al. | .......... 257/787 |
| 5,494,207 A | 2/1996 | Asanasavest | |
| 5,508,556 A | 4/1996 | Lin | |
| 5,596,231 A | * 1/1997 | Combs | .......... 257/776 |
| 5,623,123 A | 4/1997 | Umehara | |
| 5,656,550 A | 8/1997 | Tsuji et al. | |
| 5,741,729 A | 4/1998 | Selna | |
| 5,844,315 A | 12/1998 | Melton et al. | |
| 5,854,511 A | * 12/1998 | Shin et al. | .......... 257/713 |
| 5,866,948 A | 2/1999 | Murakami et al. | |
| 5,981,314 A | 11/1999 | Glenn et al. | |
| 5,990,545 A | 11/1999 | Schueller et al. | |
| 6,013,946 A | 1/2000 | Lee et al. | |
| 6,060,774 A | 5/2000 | Terui | |
| 6,060,778 A | 5/2000 | Jeong et al. | |
| 6,093,960 A | * 7/2000 | Tao et al. | .......... 257/706 |
| 6,133,070 A | 10/2000 | Yagi et al. | |
| 6,177,288 B1 | 1/2001 | Takiar | |
| 6,188,130 B1 | * 2/2001 | Ramirez et al. | .......... 257/706 |
| 6,198,171 B1 | * 3/2001 | Huang et al. | .......... 257/787 |
| 6,281,568 B1 | * 8/2001 | Glenn | .......... 257/684 |
| 6,396,139 B1 | * 5/2002 | Huang | .......... 257/696 |
| 6,437,429 B1 | * 8/2002 | Su et al. | .......... 257/666 |
| 6,501,161 B1 | * 12/2002 | Lee | .......... 257/676 |
| 6,525,406 B1 | * 2/2003 | Chung et al. | .......... 257/666 |

FOREIGN PATENT DOCUMENTS

| | | | |
|---|---|---|---|
| EP | 2059157 A | * | 4/1981 |
| JP | 3-108745 | | 5/1991 |

OTHER PUBLICATIONS

National Semiconductor Application Note 1187, "Leadless Leadframe Package (LLP)", Sep. 2000.

* cited by examiner

*Primary Examiner*—Wael Faberyl
*Assistant Examiner*—Nathan W. Ha
(74) *Attorney, Agent, or Firm*—Beyer Weaver & Thomas LLP (57) ABSTRACT

An assembly and method suitable for use in packaging integrated circuits including a support substrate for supporting an integrated circuit die embedded in a molded encapsulating cap. The substrate includes a conductive die attach pad adapted to be molded into the encapsulating cap. The pad includes an interior facing support surface and a spaced-apart exterior facing exposed surface defined by a peripheral edge. The support surface is adapted to support the embedded die, while the exposed surface is to be exposed from the encapsulating cap. The attach pad further includes a locking ledge portion extending outward peripherally beyond at least a portion of the exposed surface peripheral edge. This ledge is adapted to be subtended in the encapsulating cap in a manner substantially preventing a pull-out of the attach pad in a direction away from the encapsulating cap.

29 Claims, 7 Drawing Sheets

LOCKING LEAD TIPS AND DIE ATTACH PAD FOR A LEADLESS PACKAGE APPARATUS AND METHOD

This application claims the benefit of U.S. Provisional Application No. 60/190,587 filed on Mar. 20, 2000, the disclosure of which is incorporated herein by reference.

BACKGROUND OF THE INVENTION

Figure 1A:
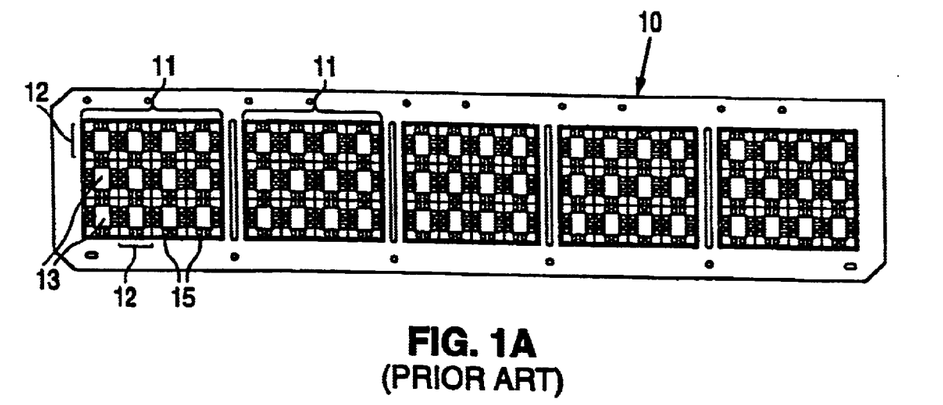
FIG. 1A is a diagrammatic top view of a conventional lead frame strip suitable for use in forming leadless leadframe packages.
Figure 1B:
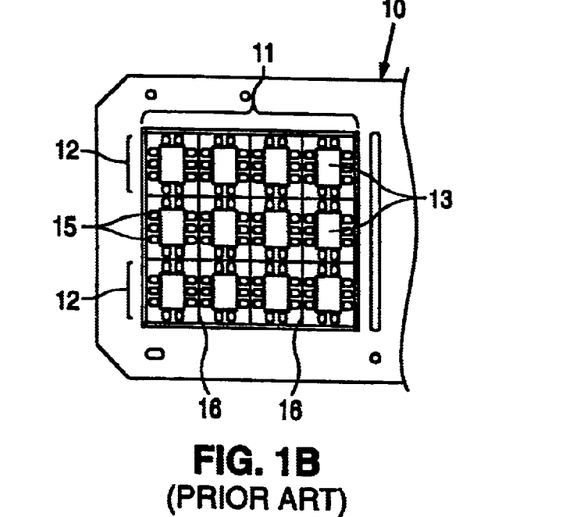
FIG. 1B is an enlarged diagrammatic top view of one end of the lead frame strip of FIG. 1A, illustrating one array of device areas.

The present invention relates generally to the packaging of small scale integrated circuits. More particularly, the invention relates to leadless leadframe package designs and manufacturing processes, A leadless leadframe package (LLP) is a relatively new integrated circuit package design that contemplates the use of a metal (typically copper) substrate in the formation of a chip scale package (CSP). As illustrated in FIGS. 1A and 1B, in typical leadless leadframe packages, a copper leadframe strip or panel 10 is patterned to define a plurality of arrays or matrix 11 of chip substrate features 12. Each chip substrate feature 12 includes a die attach pad 13 and a plurality of contacts 15 disposed about their associated die attach pad 13. Very fine tie bars 16 are used to support the die attach pads 13 and contacts 15.

Figure 2:
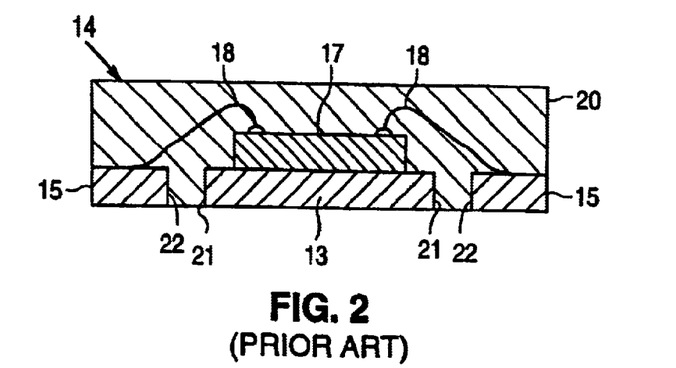
FIG. 2 is an enlarged diagrammatic cross sectional side view of a conventional leadless leadframe package.

FIG. 2 illustrates a typical resulting leadless leadframe package 14. The die attach pad 13 supports a die 17 which is electrically connected to its associated contacts 15 by bonding wires 18. A plastic cap 20 encapsulates the die 17 and bonding wires 18 and fills the gaps between the die attach pad 13 and the contacts 15 thereby serving to hold the contacts in place. It should be appreciated that during singulation, the tie bars 16 are cut and therefore the only materials holding the contacts 15 in place is the molding material. The resulting packaged chip can then be surface mounted on a printed circuit board or other substrate using conventional techniques.

During assembly, each die 17 of the array 11 is attached to a respective die attach pad and conventional wire bonding is used to electrically couple bond pads on each die to their associated contacts 15 on the leadframe panel 10. After the wire bonding, the plastic cap 20 is melted and injection or transfer molded under high pressure to encapsulate and cover the top surface of the each array 11 wire bonded dice. The dice are then singulated and tested using conventional sawing and testing techniques.

Figure 3:
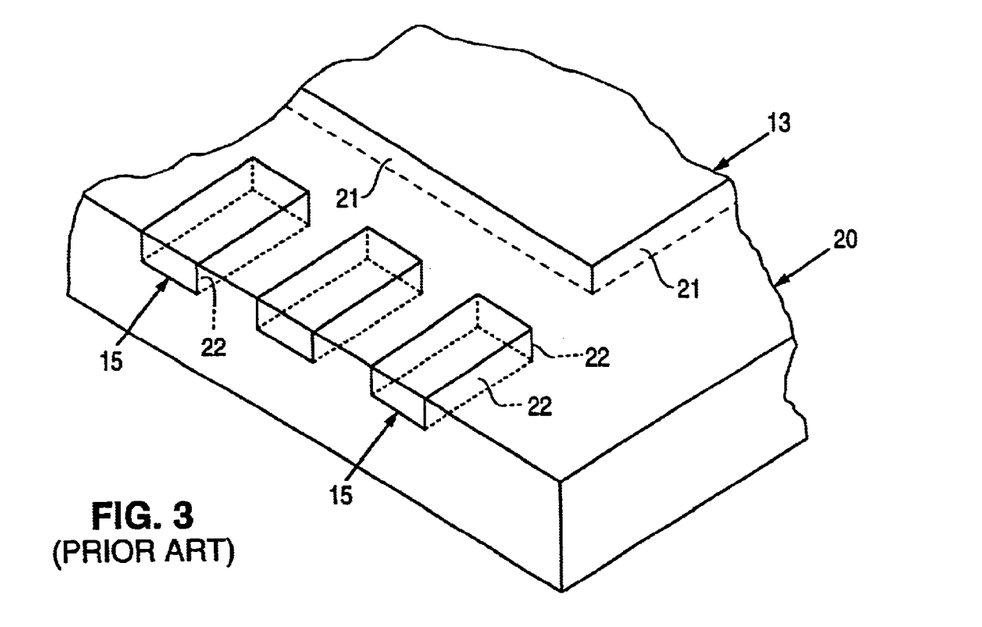
FIG. 3 is a fragmentary, enlarged, top perspective view of the conventional leadless leadframe package of FIG. 2, illustrating the side walls of the die attach pad and the contacts.

Typically, as best viewed in FIGS. 2 and 3, the die attach pad 13 and the contacts 15 are rectangular-parallelepiped in shape, having substantially vertical smooth side walls 21, 22, respectively. This design is may be problematic when moisture is introduced or becomes trapped between the respective side walls 21, 22 and the molded encapsulation cap 20. In combination with thermal cycling, these joints may occasionally loosen, causing separation and, in the worst case scenario, product failure.

Thus, although leadless leadframe packaging has proven to be a cost effective packaging arrangement, there are continuing efforts to further improve the package structure and processing to reduce production costs, improve production efficiency and/or improve production yields. As mentioned, one issue in packaging generally is the occasional mounting failure of the die attach pads and contacts with the molded encapsulating cap. In high density packaging applications such as some of the state of the art leadless packaging, it would be advantageous to improve the structural integrity between these components.

SUMMARY OF THE INVENTION

To achieve the foregoing and other objects and according to the purpose of the present invention, an improved integrated circuit device is provided that includes a support substrate for supporting an integrated circuit die embedded in a molded encapsulating cap of an integrated circuit package. The substrate includes a conductive die attach pad adapted to be molded into the encapsulating cap. The pad includes an interior facing support surface and a spaced-apart exterior facing exposed surface defined by a peripheral edge. The support surface is adapted to support the embedded die, while the exposed surface is to be exposed from the encapsulating cap. The attach pad further includes a locking ledge portion extending outward peripherally beyond at least a portion of the exposed surface peripheral edge. This ledge is adapted to be subtended in the encapsulating cap in a manner substantially preventing a pull-out of the attach pad in a direction away from the encapsulating cap.

Thus, the molded encapsulating cap cooperates with the ledge portion of the die attach pad to prevent separation of there from. Essentially, a portion of the molded encapsulating cap engages the ledge portions to promote structural integrity.

In one embodiment, a peripheral side wall of the die attach pad tapers outwardly to the locking ledge portion from the exposed surface peripheral edge thereof. In another embodiment, the locking ledge portion extends peripherally outward from the peripheral side wall at a substantially right angle thereof.

In yet another configuration, the locking ledge portion extends substantially continuously around a substantial portion of the exposed surface peripheral edge. In still another arrangement, the exposed surface peripheral edge is four-sided forming a substantially rectangular-shaped exposed surface, and the locking ledge portion extends peripherally outward from at least two sides of the four-sided exposed surface peripheral edge.

In another aspect of the present invention, a semiconductor package includes a die attach pad having a interior support surface, an opposite exposed surface and a peripheral side wall extending between the support surface and the exposed surface. The side wall intersects the exposed surface to define a peripheral edge thereof. The attach pad further includes a locking ledge portion extending peripherally outward from the side wall, and beyond at least a portion of the exposed surface peripheral edge. A plurality of contacts are disposed about the die attach pad, each having an interior surface and an opposed, spaced-apart contact surface. The package further includes an integrated circuit die attached to the support surface of the die attach pad, and a plurality of bond pads thereon. Bond wires electrically couple the respective bond pads to the interior surfaces of associated ones of the contacts. An encapsulating cap is molded over the integrated circuit die and the contacts thereby encapsulating the bonding wires. The cap being molded such that the contact surfaces of the contacts and the exposed surface of the die attach pad remain exposed while substantially completely covering the interior surfaces of the contacts. The locking ledge portion of the die attach pad is subtended in the cap in a manner substantially preventing a pull-out of the attach pad in a direction away from the cap.

In one embodiment, each the contact includes a peripheral contact side surface extending between the interior surface and the opposed contact surface. Each contact further including a locking first shoulder portion extending peripherally outward from the side surface thereof, and beyond at least a portion of a contact surface peripheral edge, wherein the first shoulder portion of each contact is subtended in the cap in a manner substantially preventing a pull-out of the contact in a direction away from the cap.

In another embodiment, the encapsulating cap includes a cap side wall and a cap contact surface containing the pad exposed surface and the contact surfaces of the contacts. The cap contact surface and the cap side wall intersect to define a cap peripheral edge thereof. Each contact is spaced-apart along the cap peripheral edge such that a contact side wall, defined by a portion of the contact side surface and by a side wall peripheral edge thereof, remains exposed along the cap side wall. Each contact further includes a locking second shoulder portion extending peripherally outward from the contact side surface, and beyond at least a portion of the side wall peripheral edge. The second shoulder portion of each contact is subtended in the cap in a manner substantially preventing a pull-out of the contact in a direction away from the cap side.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Figure 4:
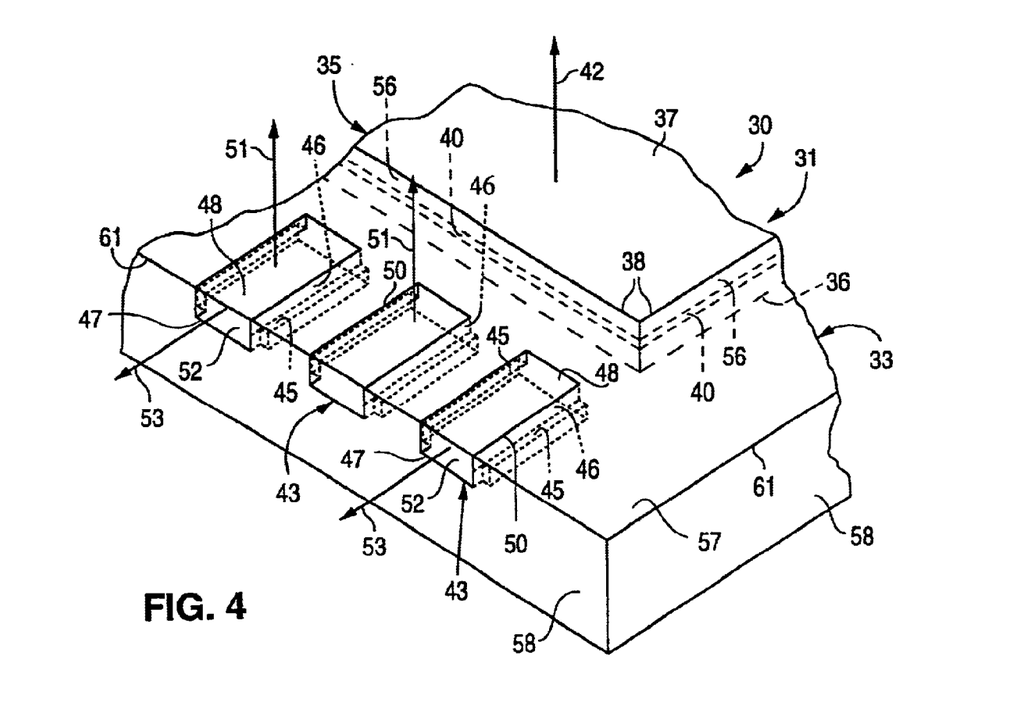
FIG. 4 is a fragmentary, enlarged, top perspective view of a leadless leadframe package constructed in accordance with the present invention.
Figure 5:
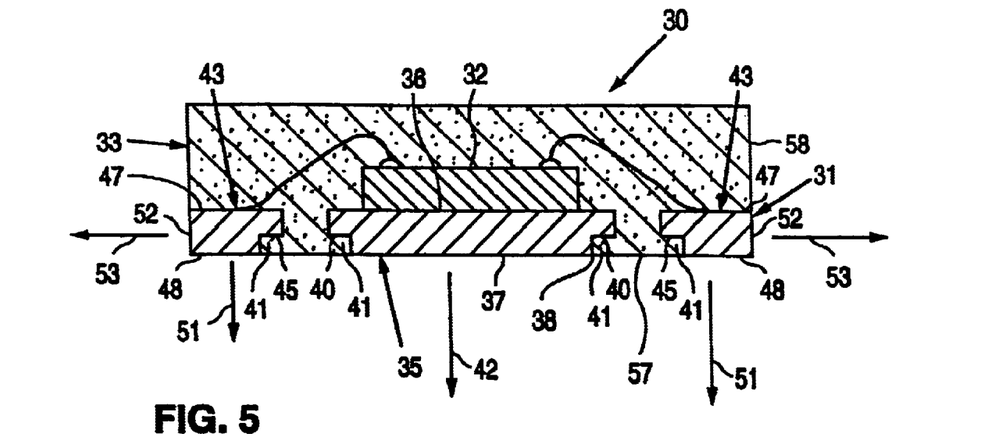
FIG. 5 is a diagrammatic cross sectional side elevation view of leadless leadframe package of FIG. 4.
Figure 6:
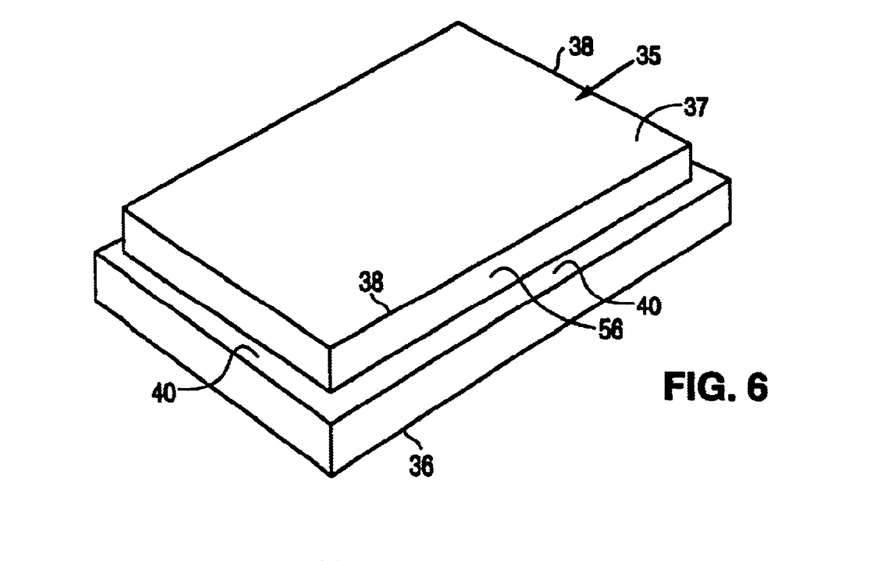
FIG. 6 is an enlarged top perspective view of a die attach pad constructed in accordance with the present invention.

Turning now to FIGS. 4–6, an improved integrated circuit package, generally designated 30, is provided that includes a support substrate 31 for supporting an integrated circuit die 32 embedded in a molded encapsulating cap 33. The substrate 31 includes a conductive die attach pad 35 adapted to be molded into the encapsulating cap 33. The pad 35 includes an interior facing support surface 36 and a spaced-apart exterior facing exposed surface 37 defined by a peripheral edge 38. The support surface 36 is adapted to support the embedded die 32, while the exposed surface 37 is to be exposed from the encapsulating cap 33. The attach pad 35 further includes a locking ledge portion 40 extending outward peripherally beyond at least a portion of the exposed surface peripheral edge 38. This ledge portion 40 is adapted to be subtended in the encapsulating cap material in a manner substantially preventing a pull-out of the attach pad 35 in a direction away from the encapsulating cap.

Figures 11, 12:
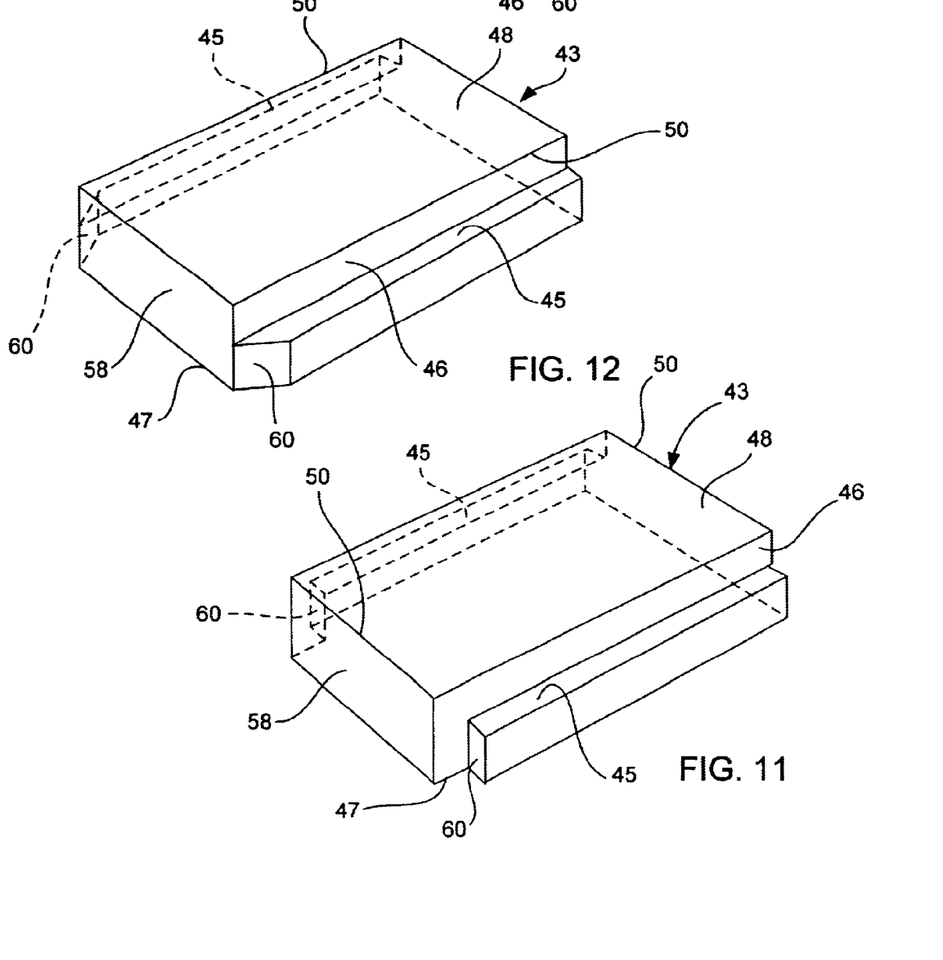
FIG. 11 is an enlarged top perspective view of a contact constructed in accordance with the present invention.
FIG. 12 is a top perspective view of an alternative embodiment to the contact of FIG. 11.
Figure 13:
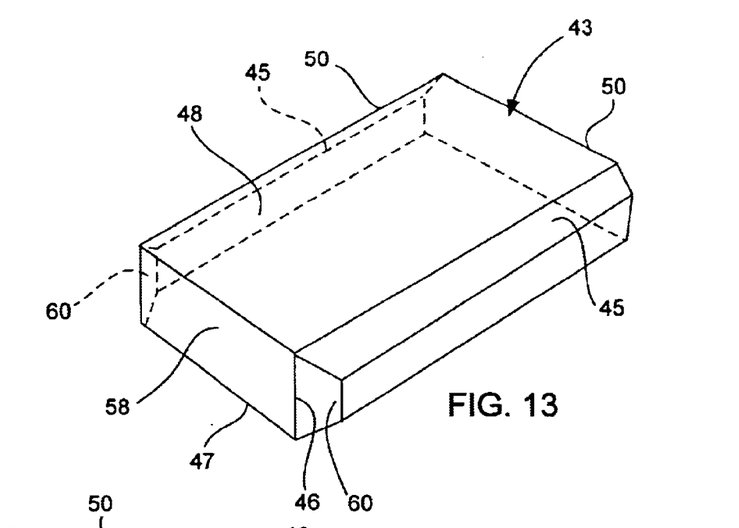
FIG. 13 is a top perspective view of another alternative embodiment to the contact of FIG. 11.
Figure 14:
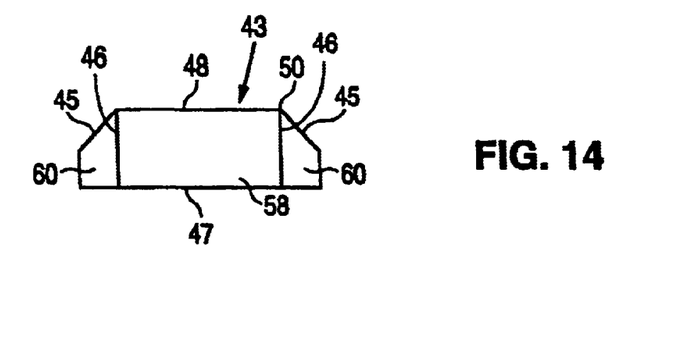
FIG. 14 is a reduced side elevation view of the alternative embodiment contact of FIG. 13.
Figure 15:
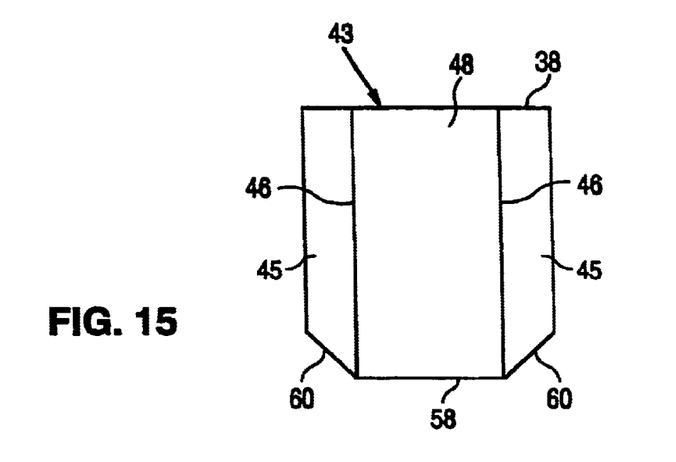
FIG. 15 is a top plan view of the alternative embodiment contact of FIG. 13.

Accordingly, as best viewed in FIGS. 4 and 5, the abutting engagement between the ledge portion 40 and a foot portion 41 of the molded cap 33 extending under the ledge portion 40 substantially prevents separation of attach pad 35 in the direction of arrow 42. This locking interengagement, therefore, promotes structural integrity, even under substantial thermal cycling In the preferred embodiment, each contact 43 of the semiconductor package 30 also includes locking structure with interengages locking shoulder portions 45 of the contact 43 with portions of the molded cap 33 to substantially prevent pull-out of the contact in a direction away from the cap. Briefly, as best illustrated in FIGS. 4, 5 and 11, each contact includes peripherally extending contact side surface 46 extending between the interior surface 47 and the opposed contact surface 48. The contact side surface 46 intersects the contact surface 48 of the contact 43 to define a contact surface peripheral edge 50 which in turn defines the area of the contact surface 48. Extending peripherally outward from the side surface 46 and peripherally beyond at least a portion of the contact surface peripheral edge 50, when viewed from a plan view of the contact surface 48, is a locking first shoulder portion 45. This outward extension is similarly subtended in the molded cap 33 to interengage with a respective foot portion 41 thereof to prevent separation of the contact in the direction of arrow 51.

Since the locking designs of the attach pad 35 and the contacts 43 are at least initially similar in concept, the detailed description of the attach pad 35 will also apply to the contacts 43 as well. The contacts 43, however, are different in that they have two exposed surfaces (i.e., the contact surface 48 and a contact side wall 52), and will require additional locking structure to prevent separation in the direction of arrow 53 in FIGS. 4 and 5, as will be described below.

Referring now to FIG. 6, an attach pad 35 is illustrated having the exposed surface 37 facing upwardly with the opposed support surface 36 facing downwardly. In the preferred embodiment, as will be described in greater detail below, these attach pads 35 along with the contacts 43 are etched from the copper panels 10 shown FIGS. 1A and 1B in side-by-side arrays 11. Each array 11 contains a plurality of device areas 55, one of which is clearly illustrated in FIG. 17. Thus, the support surface 36 and the opposed exposed surface 37 are preferably substantially planar and substantially parallel one another. Moreover, the attach pad preferably includes a four-sided peripherally extending side wall 52 which intersects the support surface 36 and the exposed surface 37 at generally right angles to generally form a rectangular prism or the like. The attach pad side walls 56 and the substantially planar exposed surface 37 intersect in a rectangular-shaped peripheral edge 38 which defines the area of the exposed surface 37.

It will be appreciated that while the attach pad 35 and the contacts 43 are preferably illustrated as rectangular-parallelepiped in shape, any other geometric shape may be applied. By way of example, the present invention may even be applied to curvilinear structures as well.

In these leadless leadframe packages, the support surface 36 is adapted to support the die 32 (FIG. 4 and 5) and is to be entirely embedded in molded cap 33, while the exposed surface 37 is to be preferably flush with a preferably planar cap contact surface 57. This arrangement enables direct contact and mounting of the contacts 43 and the attachment pad 35 to a printed circuit board or substrate (not shown).

Figure 7:
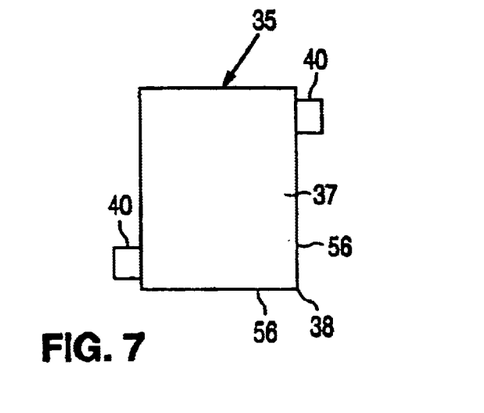
FIG. 7 is a reduced top plan view of an alternative embodiment to the die attach pad of FIG. 6.
Figure 8:
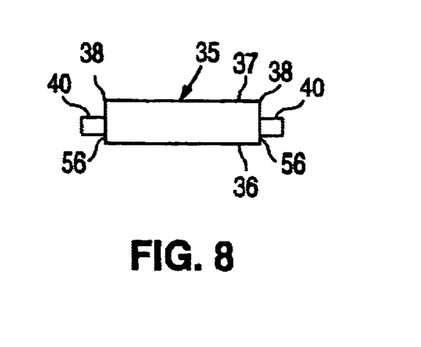
FIG. 8 is a side elevation view of the alternative embodiment die attach pad of FIG. 7.

To interengage with the encapsulating cap 33, the locking ledge portion 40 is only required to extend from the attach pad peripheral side wall 52 peripherally outward and beyond at least a portion of the exposed surface peripheral edge 38, when viewed from a plan view of the exposed surface 37, such as in FIG. 7. The surface area of the ledge portion 40 can be relatively small, as necessary to interengage with the foot portions 41 of the encapsulating cap 33 (FIGS. 7 and 8). Moreover, the ledge portion 40 may be provided by a plurality of ledge portions placed anywhere along anyone or a combination of the sides of the four-sided peripheral side wall 52. Thus, the ledge portion need not extend continuously around the side wall 52. For practical etching fabrication purposes, the ledge portion will preferably extend continuously about the side wall 52, as illustrated in FIG. 6.

To enable interengagement with the cap foot portion 41, the ledge portion 40 is required subtend in the molded encapsulation cap. Inherently, therefore, the ledge portion 40 must extend below the cap contact surface 57 of the encapsulating cap 33.

Figure 9:
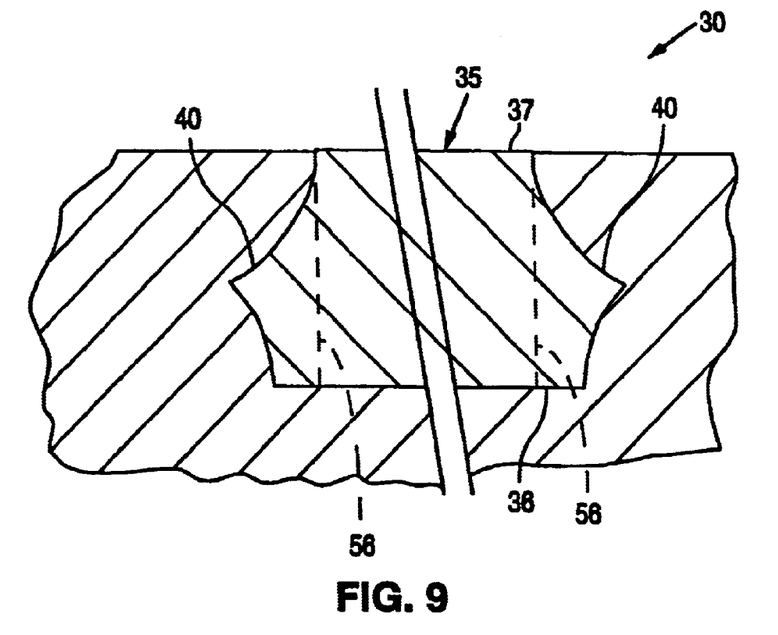
FIG. 9 is an enlarged, diagrammatic cross sectional side elevation view of the half-etched ledge portions of the die attach pad embedded in the encapsulating cap.
Figure 10:
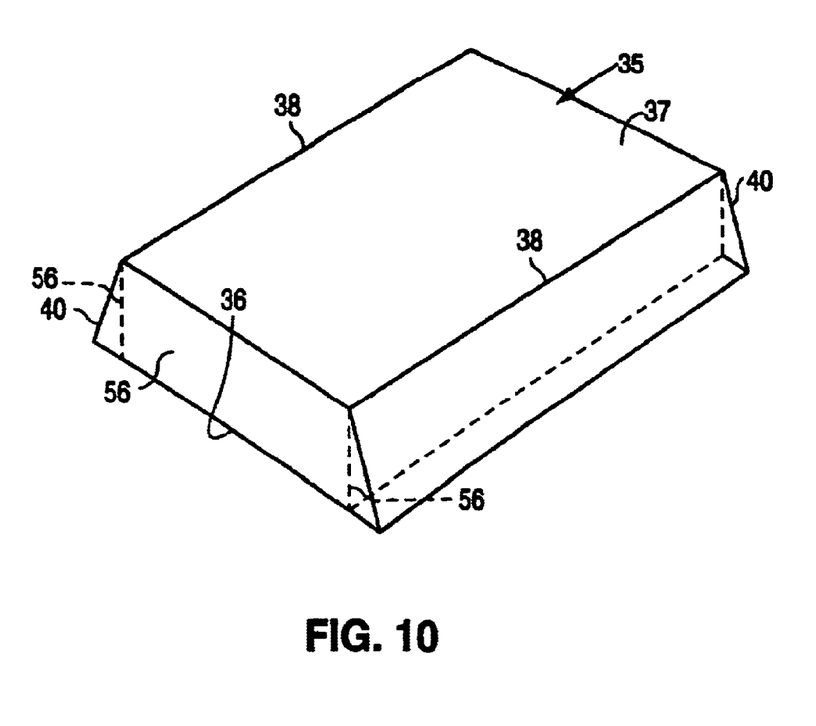
FIG. 10 is a top perspective view of an alternative embodiment to the die attach pad of FIG. 6.

Referring back to FIG. 6, the ledge portion 40 is illustrated as a stepped formation extending outwardly at a substantially right angle to, and continuously around, the peripheral side wall 52. This ledge portion design is beneficial since the entire width of the step may be employed to facilitate retainment of the attachment pad 35 to the molded cap 33. However, as will be apparent, the formation of these relatively small structures is more suitable for conventional half-etching. Depending upon the scale of the component, it may be difficult to etch a definitive step profile as illustrated in FIGS. 6 and 8. Applying the half-etching technique, the ledge portion 40 will likely have an inverted trapezoidal profile similar to a concave-shaped ledge portions 40 shown in the embodiment of FIG. 9. Although the interengagement between the foot portion 41 of the encapsulating cap 33 and the stepped ledge portion 40 may have greater structural integrity than the tapered ledge portion of FIG. 8, this design is sufficient to retain the attach pad in most instances. Other etch designs may include a ledge portion 40 with a slanted wall profile similar to that in the embodiment of FIG. 10.

As indicated above, the described technique is also preferably applied to the contacts 43 as well to prevent separation from the encapsulation cap 33 in the direction of arrow 51 in FIGS. 4 and 5. These contacts, however, are preferably arranged to not only position the contact surface 48 flush with the cap contact surface 57 of the encapsulation cap 33, but also to position a contact side wall 52 thereof flush with a cap side wall 58 of the encapsulating cap 33. This dual exposure increases electrical contact for mounting purposes. As a consequence, the locking technique of the present invention applied to prevent separation in the direction of arrow 51 is also preferably applied to the contacts to prevent separation of the contacts in the direction of arrow 53 as well.

Accordingly, each contact 43 further includes a locking second shoulder portion, generally designated 60, which extends peripherally outward from the contact side surface 46, and beyond at least a portion of the side wall peripheral edge 61 when view from a plan view of the contact side wall 52 exemplified in FIG. 4. Similar to the first shoulder portion 45, the second shoulder portion 60 of each contact 43 must be subtended in the molded cap in a manner substantially preventing a pull-out of the contact 43 in a direction away from the cap side wall (i.e., arrow 53).

Thus, the first shoulder portions 45 prevent separation from the encapsulating cap 33 away from the cap contact surface 57 (i.e., in the direction of arrow 51), while the second shoulder portions 60 prevent separation away from the cap side wall 58 (i.e., in the direction of arrow 53). In the preferred embodiment, these shoulder portions may be integrally formed with one another, as shown in FIGS. 11–15.

By way of example, the contacts 43 in FIGS. 4 and 11 illustrate a stepped design where both the first shoulder portion 45 and the second shoulder portion 60 extend peripherally outward and beyond the contact surface peripheral edge 50 and the contact side wall peripheral edge 61 at an angle generally perpendicular to the opposed contact side surface 46. As mentioned, this stepped design is beneficial since the entire width of the shoulder may be employed to facilitate retainment of the contact pad 35 to the molded cap 33 in either direction of arrow 51 or in the direction of arrow 53.

FIG. 12 best illustrates an alternative embodiment where the second shoulder portion 60 is formed as an outward taper from the cap side wall peripheral edge 61 (or the contact side surface 46). Alternatively, as illustrated is in FIGS. 13–15, the first shoulder portion 45 is also formed as an outward taper from the contact surface peripheral edge 50 (or the contact side surface 46). As above-mentioned, however, by applying the half-etching technique to form the shoulder portions, these shoulders likely have an inverted trapezoidal profile similar to a concave-shaped ledge portions 40 shown in the embodiment of FIG. 9.

Figure 16:
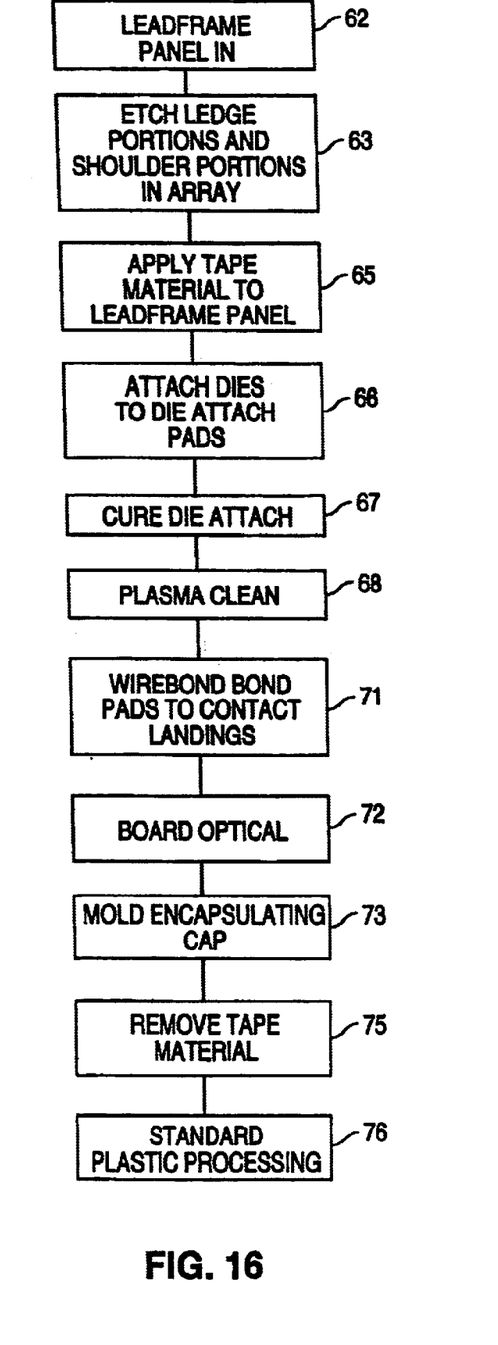
FIG. 16 is a flow diagram illustrating the process of the present invention.
Figure 17:
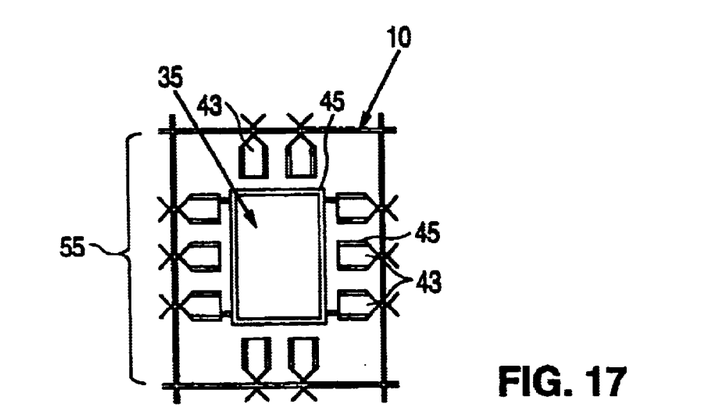
FIG. 17 is a fragmentary, top plan view of one device area of an array of device areas on a substrate panel, and illustrating the etched ledge portion of the die attach pad and the shoulder portions of the contacts in accordance with the present invention.

Referring now to the flow diagram of FIG. 16, a method of packaging integrated circuits is disclosed. As described in the background section and as shown in FIG. 17, in conventional leadless leadframe packaging, the die attach pads 35 and contacts 43 are preformed in the leadframe strip or panel 10 at 62. Preferably, the panel 10 is initially patterned to define one or more arrays 11 of device areas 55 on the surface of the panel 10. By way of example, the embodiment in FIG. 1A defines four arrays, each of which defines a matrix of device areas 55 illustrated in a strip type substrate panel 10. It should be appreciated that the number of arrays provided in any particular substrate panel and the number of device areas in each array may be very widely varied in accordance with the needs, constraints and optimizations of the particular manufacturing process.

Each device area 55, as illustrated in FIG. 17, has the appropriate surface features formed thereon. Typically, the desired surface features in each device area will include a plurality of contact 43 and a die attach pad 35. Formation of the arrays of device areas 55 (i.e., die attach pads and contacts) is preferably performed by etching the desired leadframe features into the leadframe sheet.

In accordance with the present invention, once these component features are formed, the ledge portions 40 of the die attach pad 35, and the first shoulder and second shoulder portions 45, 60 for the contacts 43 may be formed at 63 and as shown in FIG. 16. This is accomplished by partially etching (i.e., half-etch) the arrays of die attach pads 35 and the contacts 43 contained on the leadframe sheet, leaving the ledge portions 40, and the first shoulder and second shoulder portions 45, 60, respectively.

This is sometimes referred to herein as a half etch or partial etch process since the etch is intended to selectively remove some of the die attach pad 35 and the contacts at selected peripheral portions thereof rather than etch completely through the substrate panel 10. A wide variety of conventional etching techniques can be used to facilitate the etching. In one specific example, a photo-lithographic based etch process may be used. However, it should be apparent that the techniques, chemistries and or processes used to etch (or grind or otherwise form) these features can be widely varied within the scope of the present invention.

The depth of the ledge portions 40 and the first and second shoulder portions 45, 60 may be widely varied and will typically depend on a number of factors including the substrate strength desired during later processing, the desired thickness of the resultant packages and the process controls of the etching process used to form the troughs. In most implementations, as above-mentioned, it is expected that the maximum depth of ledge portions and the shoulder portions should be at least 50% of the thickness of the substrate.

Referring back to the flow diagram of FIG. 17, in some processes, we have found it helpful to adhere an adhesive tape to the bottom surface of the leadframe strip or panel 10 during the assembly at 65. The tape helps support the contacts 43 and die attach pads 35 during the die attach and wire bonding operations and also prevents flash (i.e. unwanted plastic) from forming on the underside of the leadframe strip or panel 10 during the molding process. This arrangement is more filly discussed in concurrently filed, copending Application Ser. No. 09/528,539 entitled "FLASH FREE LEADLESS PACKAGE APPARATUS AND METHOD, which is incorporated herein by reference.

At 66 the dice 32 are mounted to the support surfaces 36 of the die attach pads 35 using conventional die attachment techniques. By way of example, such mounting techniques include dispensing an epoxy adhesive one the support surface 36, and then placing the die 32 on the adhesive. Once the die attach step is cured at 67, the leadframe panel 10 may be optionally plasma cleaned at 68. Plasma cleaning is beneficial in that it removes any contamination on the areas to be wire bonded. Consequently, the reliability of the bond is improved.

Subsequently, the die bond pads 70 can be electrically connected to the associated contact 43 at 71. In the embodiment shown, wire bonding is applied to electrically couple the dice 32 to the contact 43. Bonding wires are typically formed from gold, and when gold bonding wires are used in combination with a copper substrate, it is advantageous to silver (or otherwise) plate to contact 43 to improve the adhesion of the bonding wires to the landings.

At step 72, the array of devices are optically inspected to assure quality of the die attach (at 66) and of the wire bonding (at 71).

Once these steps have been performed, one or more plastic encapsulating caps 33 are formed over the substrate panel 10 at 73. The encapsulating caps 33 may be formed using any conventional molding process including pressure transfer molding and injection molding. In the described embodiment, a molded array type transfer molding process is used. Plastic molding compound pellets (not shown), for example, are heated and liquefied, and then flown into the mold cavity under pressure. This enables the molding compound to flow between the ledge portions and the shoulder portions and the adhesive tape to form the foot portions 41. Once the molten molding compound cures, a single encapsulating cap 33 will be formed encapsulating all the device areas simultaneously.

In the described embodiment, a separate plastic cap is formed over each separate array 11 of device areas 55. However, it should be appreciated that a single cap or a different number of caps can readily be provided.

Once the encapsulating cap 33 has been formed and cured, in accordance with the present invention, the tape material may be removed from the leadframe panel 10 at 75. This removal process exposes the bare exposed surfaces 37 of the die attach pads 35 and the contact surfaces 48 of the die attach pads 35 and the associated contact 43, free of mold flash.

After removal of the tape material, any additional process steps that are desired may be performed at 76. As will be appreciated by those skilled in the art, these may include solder plating the exposed surfaces of the contact landings 41 and singulating the packaged integrated circuits.

What is claimed is:

1. A leadless leadframe semiconductor package comprising:

a die attach pad having an interior support surface, an opposite pad exposed surface and a peripheral side wall extending between the support surface and the exposed surface, said side wall intersecting said exposed surface to define a peripheral edge thereof, said attach pad further including a locking ledge portion extending peripherally outward from said side wall, and beyond at least a portion of the exposed surface peripheral edge;

a plurality of contacts positioned peripherally around and adjacent to the die attach pad, each contact having an interior surface and an opposed, spaced-apart exposed contact surface, each said contact further having a peripheral contact side surface extending between the interior surface and the opposed contact surface, each said contact side surface intersecting said contact surface to define a contact surface peripheral edge thereof, each said contact side surface further including an exposed contact side wall portion defined by a portion of the contact side surface and by a side wall peripheral edge thereof, said contact side wall protion and said exposed contact surface intersecting such that said side wall peripheral edge and said contact surface peripheral edge share an exposed common contact edge portion, each said contact further including at least one tab member having a locking first shoulder portion and a locking second shoulder portion, said first shoulder portion extending peripherally outward from said contact side surface, and beyond at least a portion of the contact surface peripheral edge, and said locking second shoulder portion extending peripherally outward from said contact side surface, and beyond at least a portion of the side wall peripheral edge, an integrated circuit die attached to the support surface of the die attach pad, and having a plurality of bond pads thereon;

a plurality of bonding wires that electrically couple the respective bond pads to the interior surfaces of associated ones of the contacts; and an encapsulating cap that is unitarily molded over the integrated circuit die, the die attach pad and the contacts thereby encapsulating the bonding wires, said cap having a bottm molding surface and a plurality of side walls, and the cap bottom molding surface and cap side walls intersecting to define a cap peripheral edge thereof, the cap being configured such that the pad exposed surface of the die attach pad and the exposed contact surface of each contact beint exposed and substantially coplanar with the cap bottom molding surface, and each exposed contact side wall portion of a respective contact being substantially flush with a respective side wall of the encapsulating cap, while said cap substantially completely covering the interior surfaces of the contacts, and such that each exposed common contact edge portion of the respective contact is in linear alignment with the cap peripheral edge, wherein the locking ledge portion of the die attach pad is subtended in the cap in a manner substantially preventing a pull-out of the attach pad in a direction away from the cap bottom molding surface, wherein the first shoulder portion of the tab member of each contact is subtended in the cap in a manner substantially preventing a pull-out of the contact in a direction away from the cap bottom molding surface, and wherein the second shoulder portion of the tab member of each contact is subtended in the cap in a manner substantially preventing a pull-out of the contact in a direction away from the cap side wall.

2. The semiconductor package as recited in claim 1, wherein said locking ledge portion extends substantially continuously around a substantial portion of the exposed surface peripheral edge.

3. The semiconductor package according to claim 1, wherein said peripheral side wall tapers outwardly to the locking ledge portion from the exposed surface peripheral edge thereof.

4. The semiconductor package according to claim 3, wherein said locking ledge portion extends substantially continuously around a substantial portion of the exposed surface peripheral edge.

5. The semiconductor package according to claim 1, wherein said peripheral side wall is substantially perpendicular to said exposed surface proximate said ledge portion, and said locking ledge portion extends peripherally outward from said peripheral side wall at a substantially right angle thereof.

6. The semiconductor package according to claim 5, wherein said locking ledge portion extends substantially continuously around a substantial portion of the exposed surface peripheral edge.

7. The semiconductor package according to claim 1, wherein the exposed surface peripheral edge is four-sided forming a substantially rectangular-shaped exposed surface.

8. The semiconductor package according to claim 7, wherein said locking ledge portion extends peripherally outward from at least two sides of the four-sided exposed surface peripheral edge.

9. The semiconductor package according to claim 8, wherein said at least two sides are opposite one another, and the respective locking ledge portions extends substantially continuously along the two sides of the exposed surface peripheral edge.

10. The semiconductor package according to claim 7, wherein said locking ledge portion extends substantially continuously around a substantial portion of the four-sided exposed surface peripheral edge.

11. The semiconductor package according to claim 1, wherein a portion said contact side surface tapers outwardly to the first shoulder portion from the contact surface peripheral edge thereof, and a portion said contact side surface tapers outwardly to the second shoulder portion from the side wall peripheral edge thereof.

12. The semiconductor package according to claim 1, wherein each said peripheral contact surface is substantially perpendicular to the respective contact surface of the contact proximate the respective first shoulder portion, each said first shoulder portion extends peripherally outward from said peripheral contact surface at a substantially right angle thereof, each said peripheral contact surface is further substantially perpendicular to the respective contact side wall of the contact proximate the respective second shoulder portion, and each said second shoulder portion extends peripherally outward from the respective peripheral contact surface at a substantially right angle thereof.

13. The semiconductor package according to claim 1, wherein the respective contact surface peripheral edge is four-sided forming a substantially rectangular-shaped contact surface, and the respective side wall peripheral edge is four-sided forming a substantially rectangular-shaped contact side wall, said contact surface and said contact side wall sharing a common edge thereof.

14. The semiconductor package according to claim 1, wherein the pad peripheral side wall tapers outwardly to the locking ledge portion from the exposed surface peripheral edge thereof.

15. The semiconductor package according to claim 14, wherein said locking ledge portion extends substantially continuously around a substantial portion of the exposed surface peripheral edge.

16. The semiconductor package according to claim 1, wherein the pad peripheral side wall is substantially perpendicular to said exposed surface proximate said ledge portion, and said locking ledge portion extends peripherally outward from said peripheral side wall at a substantially right angle thereof.

17. The semiconductor package according to claim 1, wherein said first shoulder portion and said second shoulder portion of at least one contact are formed from a common ledge portion extending outwardly from said contact side surface.

18. A leadless leadframe device for fabricating a plurality of semiconductor packages each including an integrated circuit die embedded in a molded encapsulating cap, and each singulated during a singulation event, said leadframe device comprising:

a conductive leadframe panel including at least one array of conductive die attach pads each having an interior facing support surface for supporting the embedded die, and a spaced-apart exterior facing exposed surface to be exposed from the encapsulating cap and defined by a peripheral edge, said attach pad further including a locking ledge portion extending outward peripherally beyond at least a portion of the exposed surface peripheral edge and adapted to be subtended in the encapsulating cap in a manner substantially preventing a pull-out of the attach pad in a direction away from the encapsulating cap, and a plurality of contacts disposed around each attach pad in said array, each said contact having an interior surface and an opposed, spaced-apart exposed contact surface, each said contact further including a peripheral contact side surface extending between the interior surface and the opposed contact surface, each said contact side surface intersecting said contact surface to define a contact surface peripheral edge thereof, each said contact side surface further inlcluding an exposed contact side wall portion defined by a portion of the contact side surface, upon the singulation event, and by a side wall peripheral edge threof, said contact side wall portion and said exposed contat surfae intersecting such that said side wall peripheral edge and said contact surface peripheral edge share a common contact edge portion each of which is oriented to be in substantially linear alignment with a cap peripheral edge of each semiconductor package, each said contact further including at least one tab member having a locking first shoulder portion and a locking second shoulder portion, said first shoulder portion extending peripherally outward from said contact side surface, and beyond at least a portion of the contact surface peripheral edge such that the first shoulder portion of the tab member of each contact is subtended in the cap in a manner substantially preventing a pull-out of the contact in a direction away from the cap, and said locking second shoulder portion extending peripherally outward from said contact side surface, and beyond at least a portion of the side wall peripheral edge such that the second shoulder portion of the tab member of each contact is subtended in the cap in a manner substantially preventing a pull-out of the contact in a direction away from the cap side wall.

19. The leadframe device as recited in claim 18, wherein said locking ledge portion extends substantially continuously around a substantial portion of the exposed surface peripheral edge.

20. The leadframe device according to claim 18, wherein said peripheral side wall tapers outwardly to the locking ledge portion from the exposed surface peripheral edge thereof.

21. The leadframe device according to claim 20, wherein said locking ledge portion extends substantially continuously around a substantial portion of the exposed surface peripheral edge.

22. The leadframe device according to claim 18, wherein said peripheral side wall is substantially perpendicular to said exposed surface proximate said ledge portion, and said locking ledge portion extends peripherally outward from said peripheral side wall at a substantially right angle thereof.

23. The leadframe device according to claim 18, wherein a portion said contact side surface tapers outwardly to the first shoulder portion from the contact surface peripheral edge thereof, and a portion said contact side surface tapers outwardly to the second shoulder portion from the side wall peripheral edge thereof.

24. The leadframe device according to claim 18, wherein each said peripheral contact surface is substantially perpendicular to the respective contact surface of the contact proximate the respective first shoulder portion, each said first shoulder portion extends peripherally outward from said peripheral contact surface at a substantially right angle thereof, each said peripheral contact surface is further substantially perpendicular to the respective contact side wall of the contact proximate the respective second shoulder portion, and each said second shoulder portion extends peripherally outward from the respective peripheral contact surface at a substantially right angle thereof.

25. The leadframe device according to claim 18, wherein the respective contact surface peripheral edge is four-sided forming a substantially rectangular-shaped contact surface, and the respective side wall peripheral edge is four-sided forming a substantially rectangular-shaped contact side wall, said contact surface and said contact side wall sharing a common edge thereof.

26. The leadframe device according to claim 18, wherein the pad peripheral side wall tapers outwardly to the locking ledge portion from the exposed surface peripheral edge thereof.

27. The leadframe device according to claim 26, wherein said locking ledge portion extends substantially continuously around a substantial portion of the exposed surface peripheral edge.

28. The leadframe device according to claim 18, wherein the pad peripheral side wall is substantially perpendicular to said exposed surface proximate said ledge portion, and said locking ledge portion extends peripherally outward from said peripheral side wall at a substantially right angle thereof.

29. The leadframe device according to claim 18, wherein said first shoulder portion and said second shoulder portion of at least one contact are formed from a common ledge portion extending outwardly from said contact side surface.

* * * * *

UNITED STATES PATENT AND TRADEMARK OFFICE
CERTIFICATE OF CORRECTION

PATENT NO.    : 6,686,652 B1
DATED         : February 3, 2004
INVENTOR(S)   : Jaime Bayan et al.

It is certified that error appears in the above-identified patent and that said Letters Patent is hereby corrected as shown below:

Column 7,
Line 53, change "filly" to -- fully --.

Column 9,
Line 16, change "bottm" to -- bottom --.
Line 21, change "beint" to -- being --.

Column 11,
Line 38, change "inlcluding" to -- including --.
Line 41, change "threof" to -- thereof --.
Line 42, change "contat surfae" to -- contact surface --.

Signed and Sealed this

Twenty-seventh Day of July, 2004

JON W. DUDAS
*Acting Director of the United States Patent and Trademark Office*